(12) United States Patent
Chang et al.

(10) Patent No.: US 10,515,951 B2
(45) Date of Patent: Dec. 24, 2019

(54) SEMICONDUCTOR DEVICE AND METHOD

(71) Applicant: Taiwan Semiconductor Manufacturing Company, Ltd., Hsin-Chu (TW)

(72) Inventors: Shih-Chieh Chang, Taipei (TW); Cheng-Han Lee, New Taipei (TW); Yi-Min Huang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/401,923

(22) Filed: Jan. 9, 2017

(65) Prior Publication Data
US 2018/0151563 A1     May 31, 2018

Related U.S. Application Data

(60) Provisional application No. 62/427,536, filed on Nov. 29, 2016.

(51) Int. Cl.
| | | |
|---|---|---|
| *H01L 27/088* | (2006.01) | |
| *H01L 29/417* | (2006.01) | |
| *H01L 29/78* | (2006.01) | |
| *H01L 21/306* | (2006.01) | |
| *H01L 21/8234* | (2006.01) | |
| *H01L 29/04* | (2006.01) | |
| *H01L 29/06* | (2006.01) | |

(Continued)

(52) U.S. Cl.
CPC .... *H01L 27/0886* (2013.01); *H01L 21/30604* (2013.01); *H01L 21/823418* (2013.01); *H01L 21/823431* (2013.01); *H01L 29/045* (2013.01); *H01L 29/0649* (2013.01); *H01L 29/167* (2013.01); *H01L 29/41791* (2013.01); *H01L 29/66795* (2013.01); *H01L 29/7853* (2013.01)

(58) Field of Classification Search
CPC ............. H01L 29/66795; H01L 29/785; H01L 29/7848; H01L 29/7855; H01L 29/66636; H01L 27/0886; H01L 21/02293; H01L 29/7842; H01L 29/165; H01L 29/06; H01L 29/045; H01L 21/3088; H01L 21/3086; H01L 21/3085; H01L 21/30604; H01L 21/304; H01L 29/66651; H01L 21/02532; H01L 21/02433; H01L 21/02381; H01L 29/0653; H01L 21/02609
USPC ................ 257/288, 327, 345, 369, E21.224, 257/E21.409, 401; 438/197, 478
See application file for complete search history.

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |

(Continued)

OTHER PUBLICATIONS

Haung, et al., "Semiconductor Device and Method," U.S. Appl. No. 15/284,101, Taiwan Semiconductor Manufacturing Company, Ltd., filed Oct. 3 2016, 51 pages.

*Primary Examiner* — Mouloucoulaye Inoussa
(74) *Attorney, Agent, or Firm* — Slater Matsil, LLP

(57) ABSTRACT

A process for manufacturing a semiconductor device and the resulting structure are presented. In an embodiment a source/drain region is grown. Once grown, the source/drain region is reshaped in order to remove facets. The reshaping may be performed using an etching process whereby a lateral etch rate of the source/drain region is larger than a vertical etch rate of the source/drain region.

20 Claims, 13 Drawing Sheets

(51) Int. Cl.
*H01L 29/167* (2006.01)
*H01L 29/66* (2006.01)

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 2007/0252211 A1* | 11/2007 | Yagishita .............. H01L 29/045 257/351 |
| 2007/0298552 A1 | 12/2007 | Dyer et al. |
| 2013/0082304 A1 | 4/2013 | Liu et al. |
| 2013/0154001 A1 | 6/2013 | Cai et al. |
| 2013/0230958 A1 | 9/2013 | Lee et al. |
| 2014/0070360 A1* | 3/2014 | Liu .................. H01L 29/66795 257/506 |
| 2014/0183605 A1* | 7/2014 | Mochizuki ............ H01L 29/785 257/288 |
| 2015/0333061 A1* | 11/2015 | Kim .................... H01L 27/0886 257/401 |
| 2016/0042963 A1* | 2/2016 | Kim .................... H01L 21/0262 438/507 |
| 2016/0126093 A1* | 5/2016 | Dube ................ H01L 21/02532 438/481 |
| 2016/0343845 A1 | 11/2016 | Chen |

\* cited by examiner

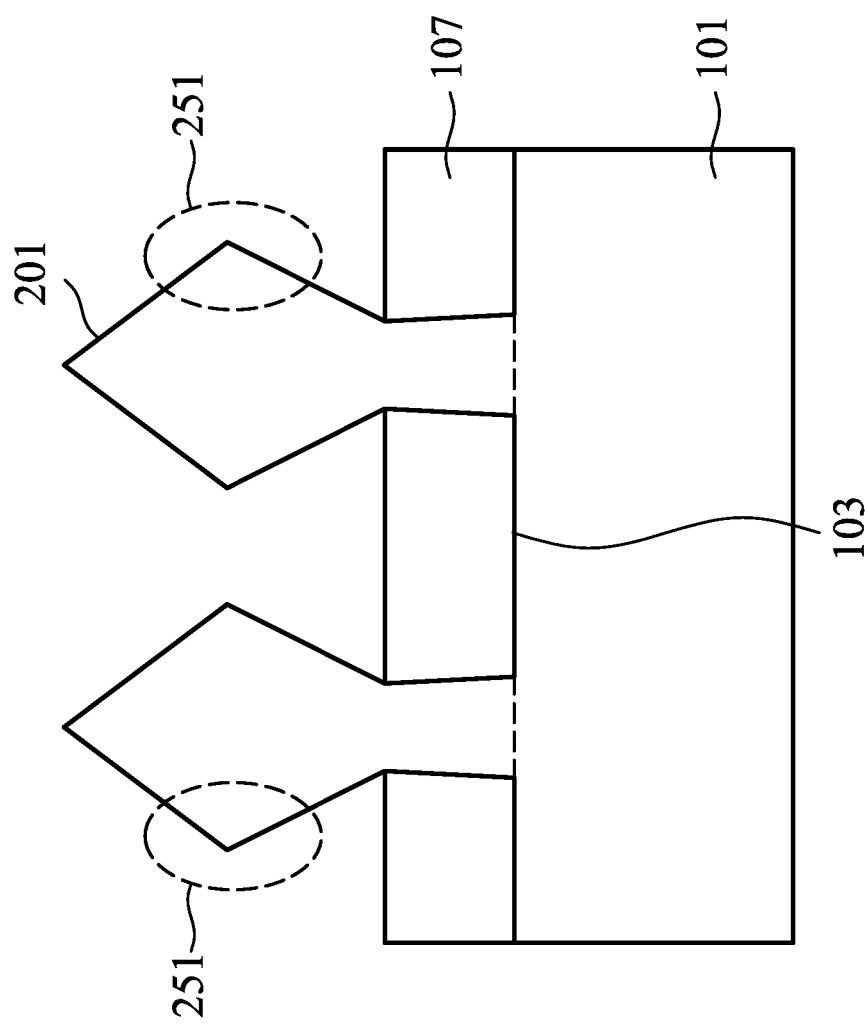

SEMICONDUCTOR DEVICE AND METHOD

PRIORITY CLAIM

This application claims the benefit of U.S. Provisional Application No. 62/427,536, filed on Nov. 29, 2016 and entitled "Semiconductor Device and Method," which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
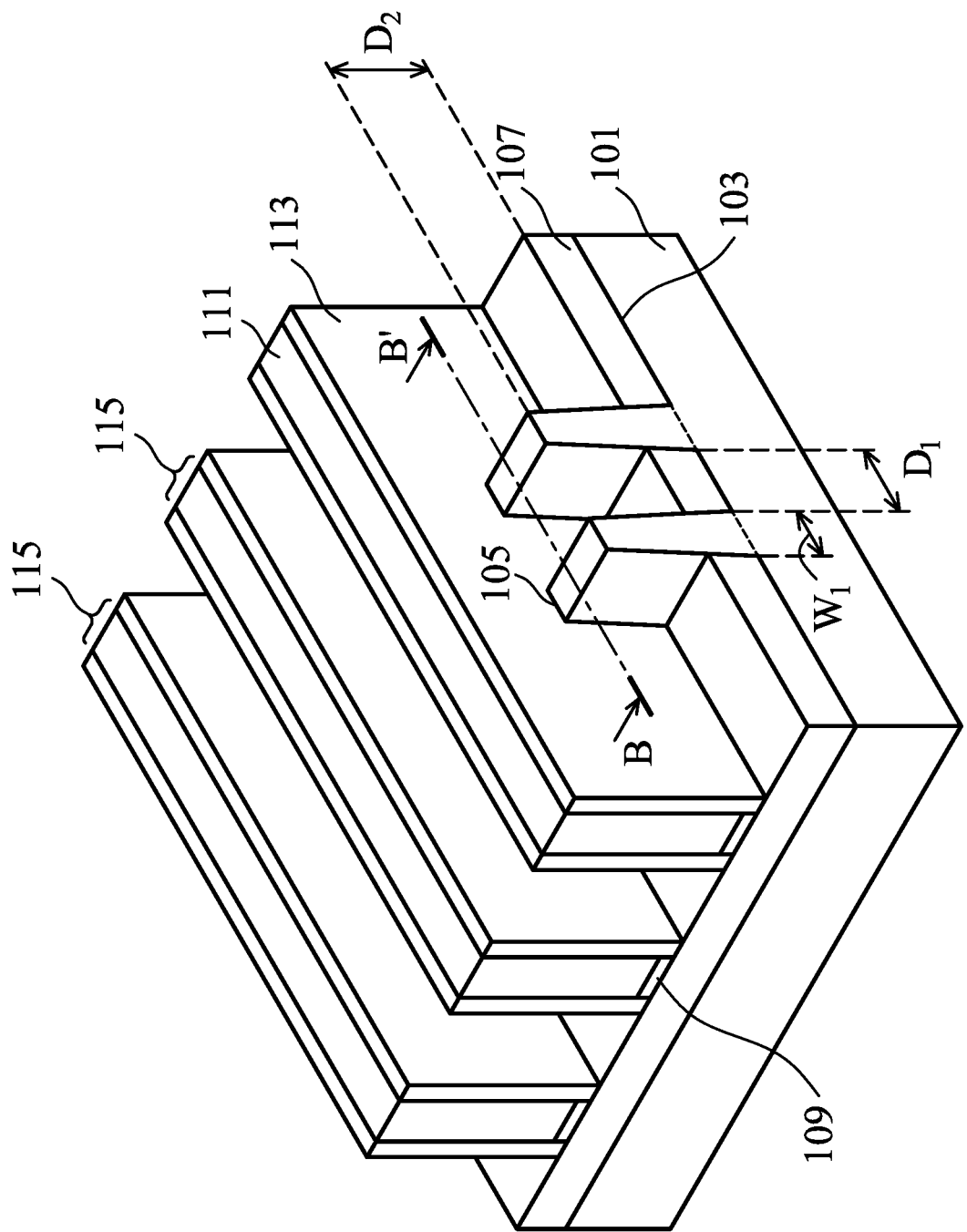
FIGS. 1A-1C illustrate a finFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-1C, 2A-2D, and 3A-B illustrate a process of forming a finFET device including epitaxially grown source/drain regions that are subjected to a shaping process.

Figure 1B:
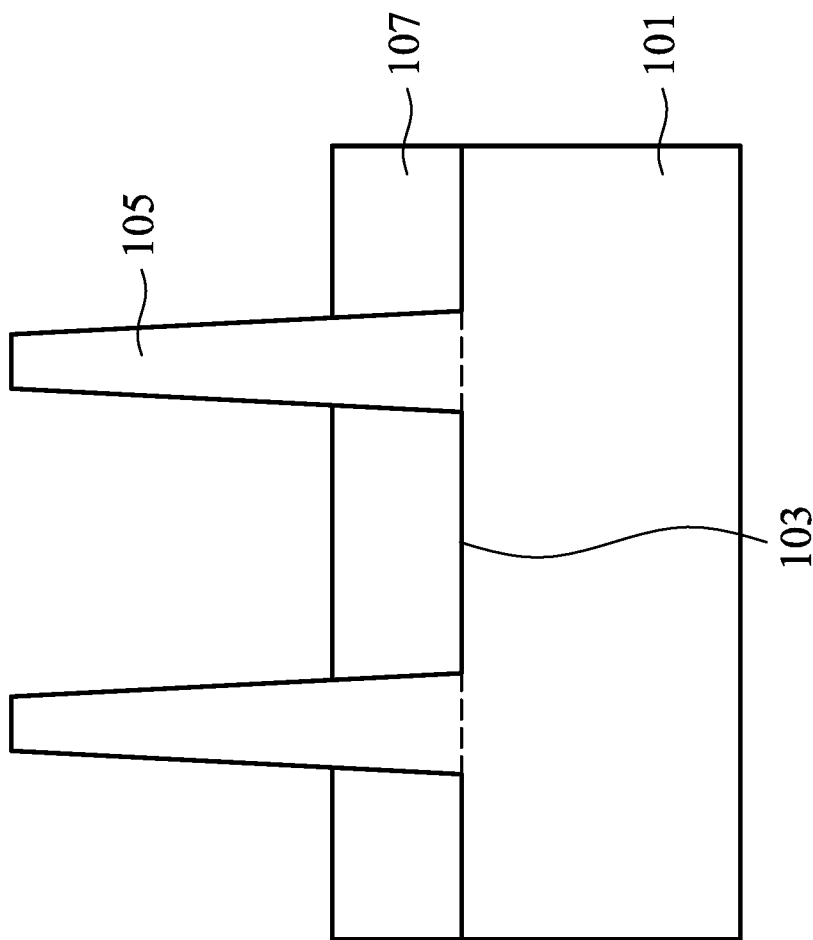

With reference now to FIGS. 1A-1B, with FIG. 1B illustrating a cross-sectional view of FIG. 1A along line B-B', there is shown a substrate 101 with first trenches 103 formed therein. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 107. The first trenches 103 may be formed using a masking layer (not separately illustrated in FIGS. 1A-1B) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 105 from those portions of the substrate 101 that remain unremoved. For convenience the fins 105 have been illustrated in the figures as being separated from the substrate 101 by a dashed line, although a physical indication of the separation may or may not be present. These fins 105 may be used, as discussed below, to form the channel region of multiple-gate FinFET transistors. While FIGS. 1A-1B only illustrates two fins 105 formed from the substrate 101, any number of fins 105 may be utilized.

The fins 105 may be formed such that they have a first width $W_1$ at the surface of the substrate 101 of between about 5 nm and about 80 nm, such as about 30 nm. Additionally, the fins 105 may be spaced apart from each other by a first distance $D_1$ of between about 10 nm and about 100 nm, such as about 50 nm. By spacing the fins 105 in such a fashion, the fins 105 may each form a separate channel region while still being close enough to share a common gate (discussed further below).

Once the first trenches 103 and the fins 105 have been formed, the first trenches 103 may be filled with a dielectric material and the dielectric material may be recessed within the first trenches 103 to form the first isolation regions 107. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 105 through a suitable process such as chemical mechanical polishing (CMP), an etch, a combination of these, or the like. In an embodiment, the removal process removes any dielectric material that is located over the fins 105 as well, so that the removal of the dielectric material will expose the surface of the fins 105 to further processing steps.

Once the first trenches 103 have been filled with the dielectric material, the dielectric material may then be recessed away from the surface of the fins 105. The recessing may be performed to expose at least a portion of the sidewalls of the fins 105 adjacent to the top surface of the fins 105. The dielectric material may be recessed using a wet etch by dipping the top surface of the fins 105 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a second distance $D_2$ from the surface of the fins 105 of between about 50 Å and about 500 Å, such as about 400 Å, and may have a height of about 150 nm, although any suitable dimensions may be utilized. Additionally, the recessing may also remove any leftover dielectric material located over the fins 105 to ensure that the fins 105 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 107 have been formed, a gate dielectric 109, a gate electrode 111 over the gate dielectric 109, and first spacers 113 may be formed over each of the fins 105. In an embodiment the gate dielectric 109 may be formed by thermal oxidation, chemical vapor deposition, sputtering, or any other methods known and used in the art for forming a gate dielectric. Depending on the technique of gate dielectric formation, the gate dielectric 109 thickness on the top of the fins 105 may be different from the gate dielectric thickness on the sidewall of the fins 105.

The gate dielectric 109 may comprise a material such as silicon dioxide or silicon oxynitride with a thickness ranging from about 3 angstroms to about 100 angstroms, such as about 10 angstroms. The gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the gate dielectric 109.

The gate electrode 111 may comprise a conductive material and may be selected from a group comprising of polycrystalline-silicon (poly-Si), poly-crystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc.

The gate electrode 111 may be deposited by chemical vapor deposition (CVD), sputter deposition, or other techniques known and used in the art for depositing conductive materials. The thickness of the gate electrode 111 may be in the range of about 200 angstroms to about 4,000 angstroms. The top surface of the gate electrode 111 may have a non-planar top surface, and may be planarized prior to patterning of the gate electrode 111 or gate etch. Ions may or may not be introduced into the gate electrode 111 at this point. Ions may be introduced, for example, by ion implantation techniques.

Once formed, the gate dielectric 109 and the gate electrode 111 may be patterned to form a series of gate stacks 115 over the fins 105. The gate stacks 115 define multiple channel regions located on each side of the fins 105 beneath the gate dielectric 109. The gate stacks 115 may be formed by depositing and patterning a gate mask (not shown) on the gate electrode 111 using, for example, deposition and photolithography techniques known in the art. The gate mask may incorporate commonly used masking materials, such as (but not limited to) photoresist material, silicon oxide, silicon oxynitride, and/or silicon nitride. The gate electrode 111 and the gate dielectric 109 may be etched using a dry etching process to form the patterned gate stacks 115.

Once the gate stacks 115 have been patterned, the first spacers 113 may be formed. The first spacers 113 may be formed on opposing sides of the gate stacks 115. The first spacers 113 are typically formed by blanket depositing a spacer layer (not separately illustrated in FIG. 1A) on the previously formed structure. The spacer layer may comprise SiN, oxynitride, SiC, SiON, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 107. The first spacers 113 may then be patterned, such as by one or more etches to remove the spacer layer from the horizontal surfaces of the structure, to form the first spacers 113.

Figure 1C:
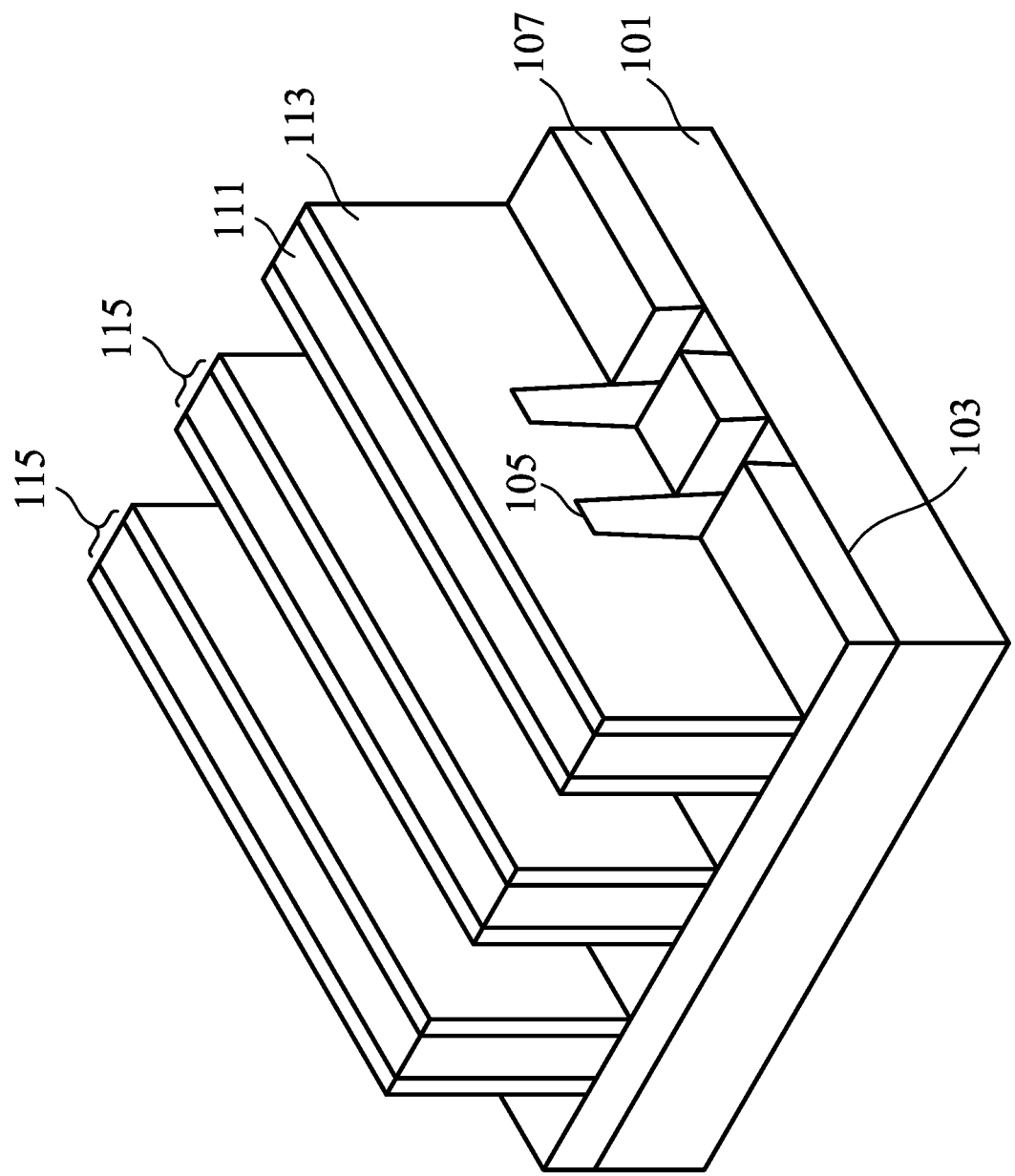

FIG. 1C illustrates a removal of the fins 105 from those areas not protected by the gate stacks 115 and the first spacers 113. The removal of the fins 105 from those areas not protected by the gate stacks 115 and the first spacers 113 may be performed by a reactive ion etch (RIE) using the gate stacks 115 and the first spacers 113 as hardmasks, or by any other suitable removal process. The removal may be continued until the fins 105 are either planar with (as illustrated) or below the surface of the first isolation regions 107 to form holes with a defined depth such as being as deep as the first isolation regions 107.

Figure 2A:
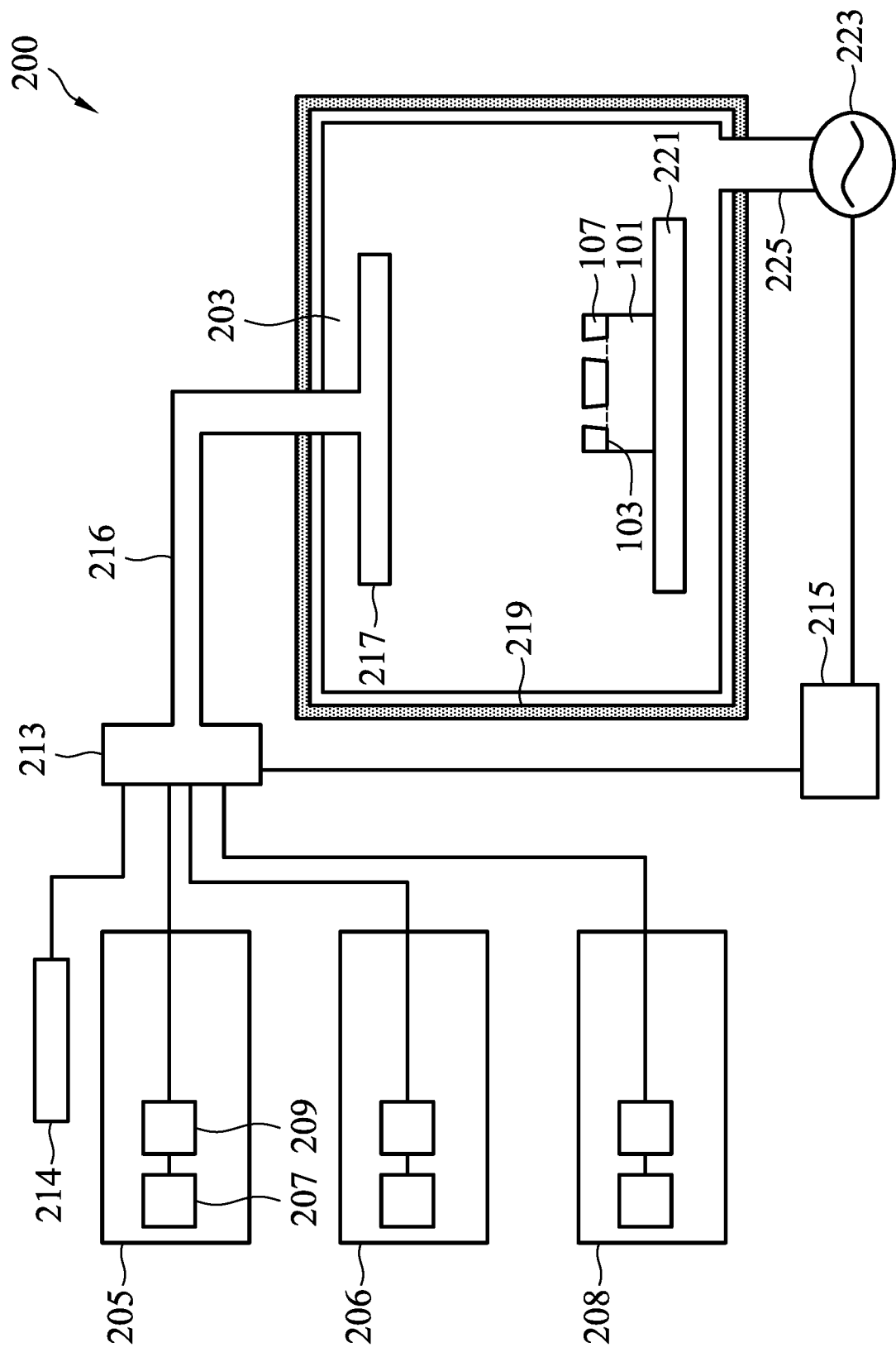
FIGS. 2A-2E illustrate a growth process of source/drain regions in accordance with some embodiments.
Figure 2B:
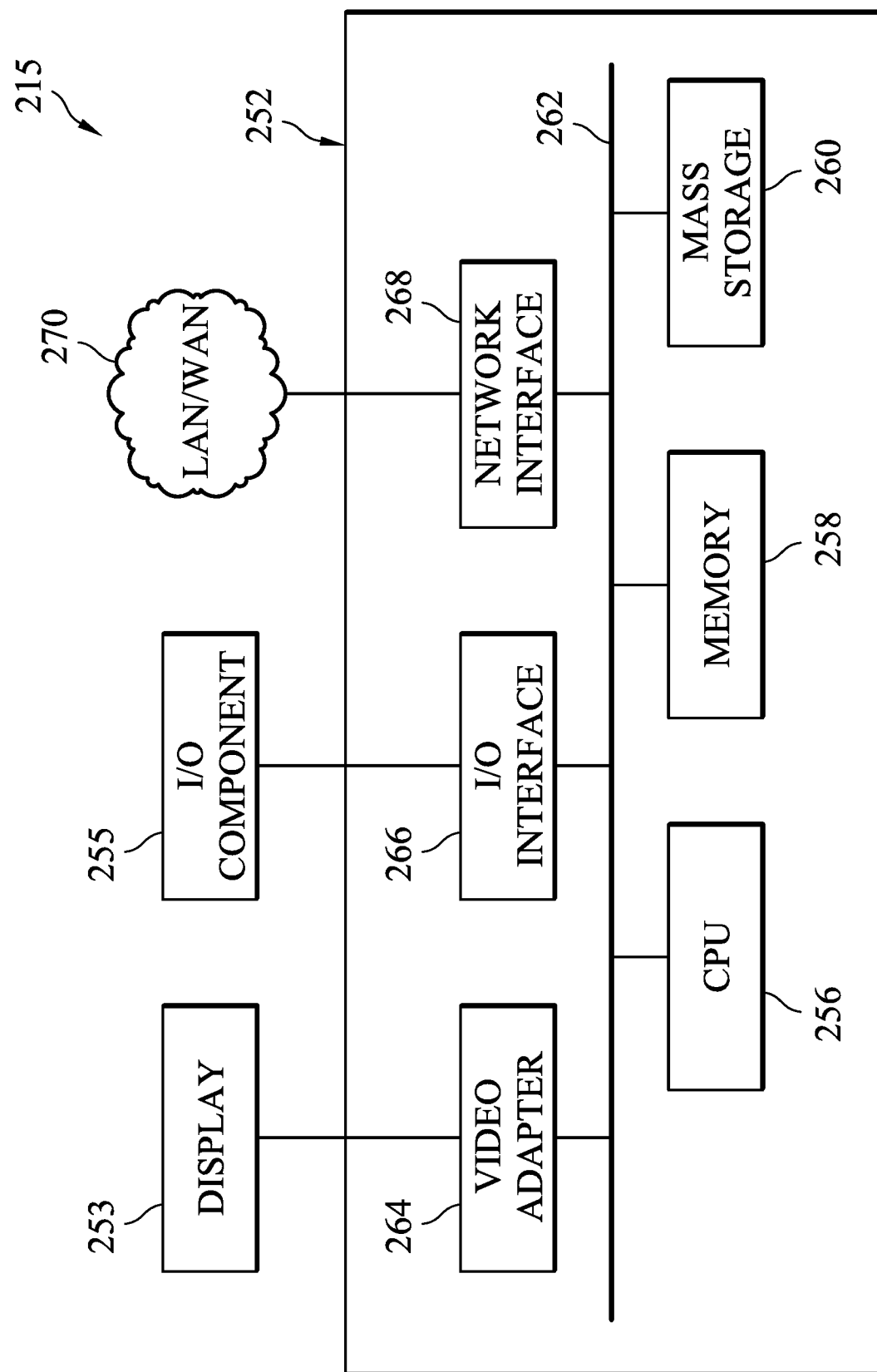
Figures 1, 2C:
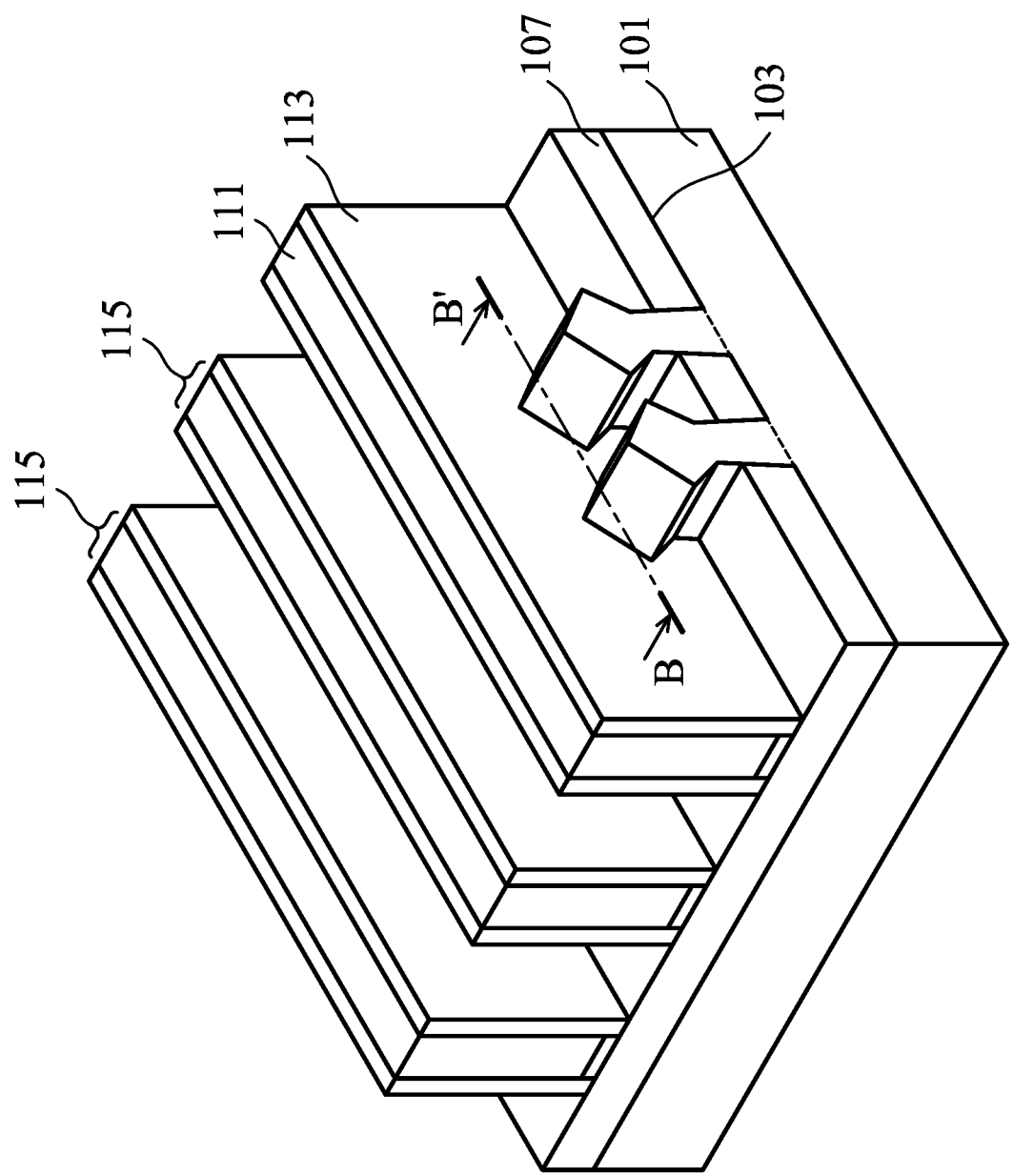
Figure 2D:
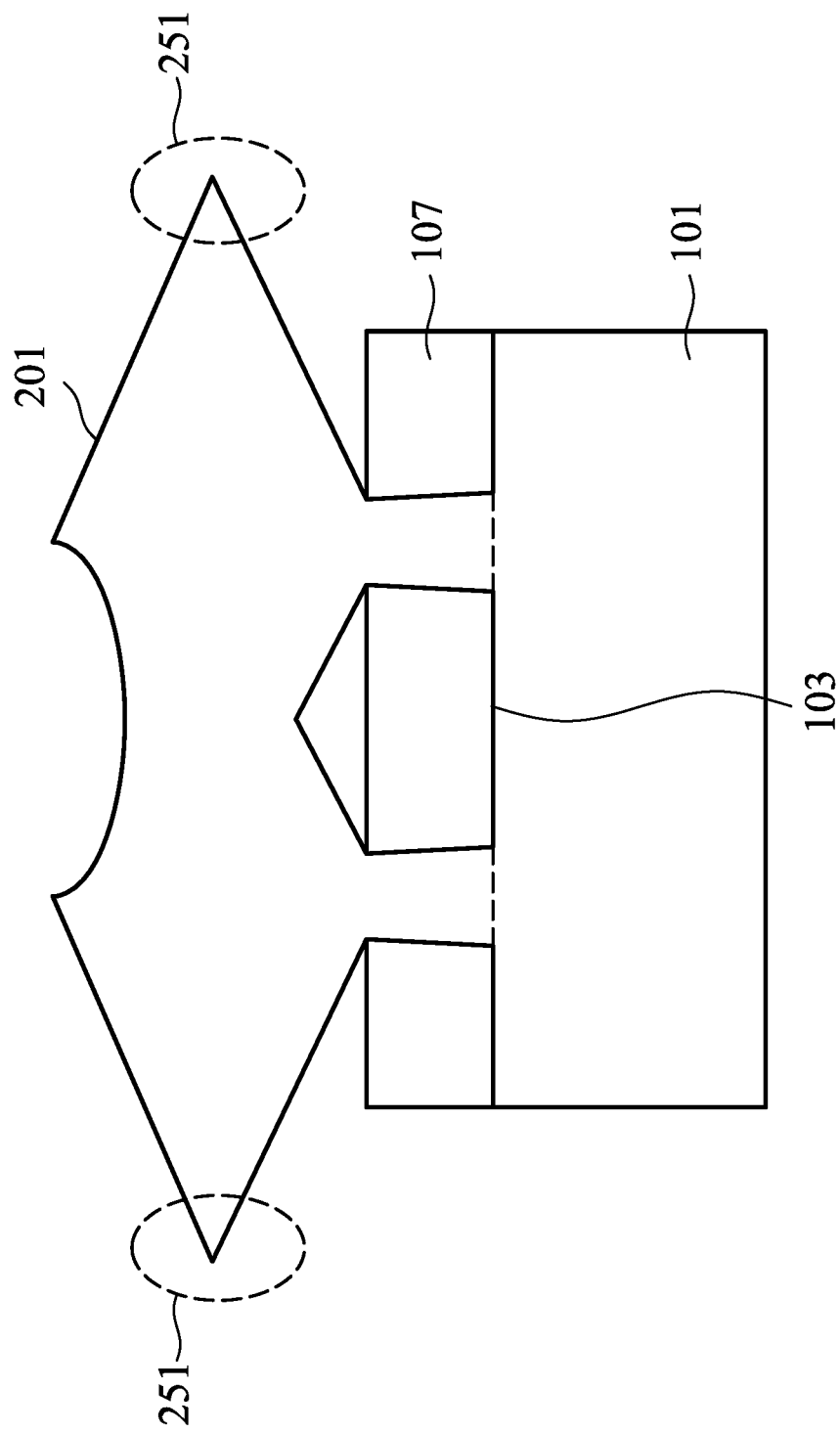
Figure 2E:
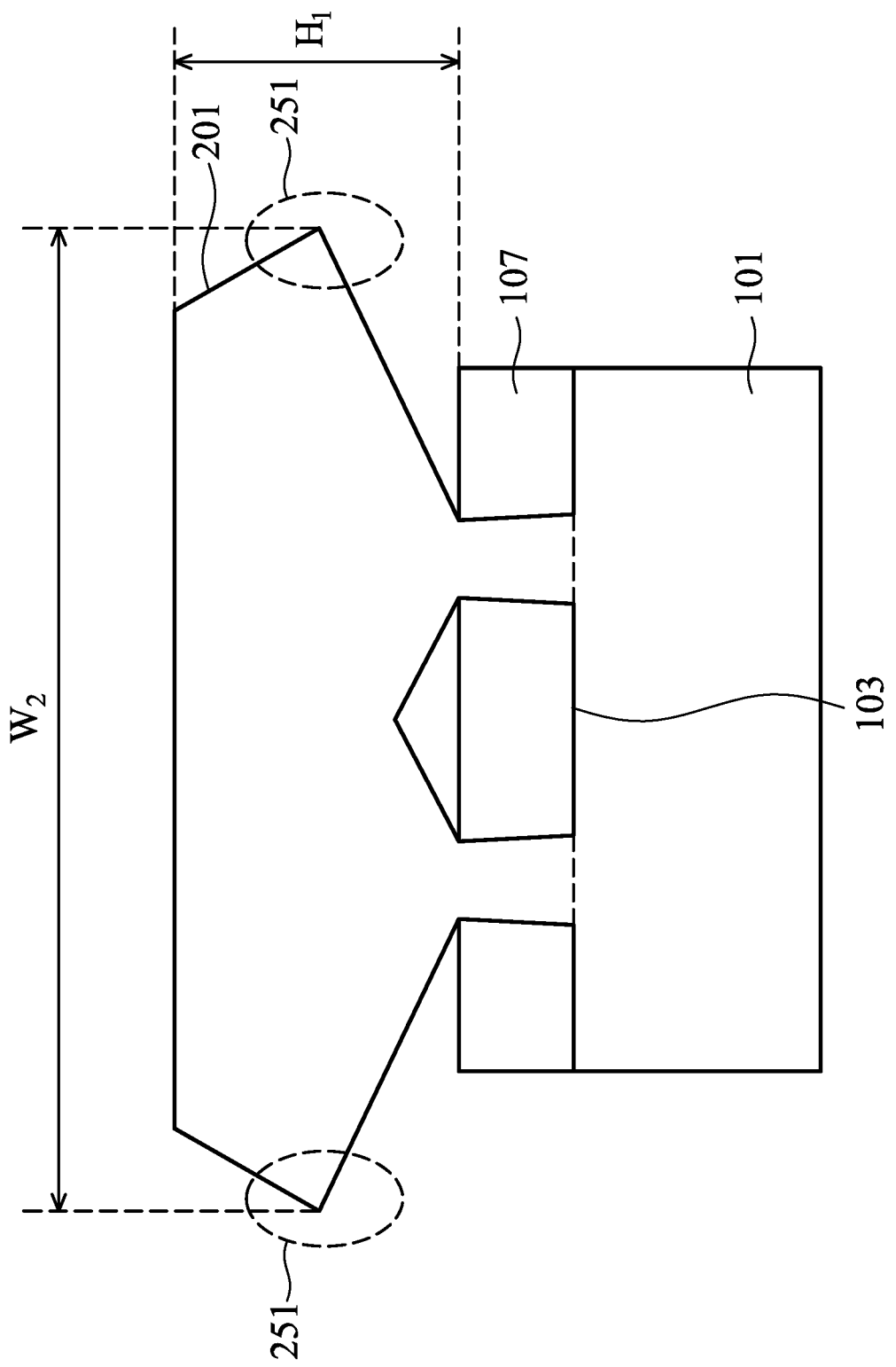

FIGS. 2A-2E illustrate a growth of material on the remaining portions of the fins 105 after the holes are formed (see FIG. 1C) to form source/drain regions 201, with FIGS. 2C-2E illustrating a progression of growth from the growth process. FIG. 2C-2 is a cross-sectional view of FIG. 2C-1 along line B-B'. FIGS. 2D and 2E are also along the same line B-B' but with further processing performed. In an embodiment wherein the fins 105 comprise silicon, the source/drain regions 201 may be grown on the fins 105 through a selective epitaxial process with a doped material such as silicon phosphorous (SiP), phosphorous-doped silicon carbon (SiCP), combinations of these, or the like. However, any suitable material may be utilized.

In an embodiment the epitaxial growth process used to form the source/drain regions 201 may utilize an epitaxial growth system 200 such as illustrated in FIG. 2A. The epitaxial growth system 200 may be utilized to receive precursor materials from a first precursor delivery system 205, a second precursor delivery system 206, and a third precursor delivery system 208 and grow materials (e.g., for the source/drain regions 201) on the fins 105. In an embodiment the first precursor delivery system 205, the second precursor delivery system 206, and the third precursor delivery system 208 work in conjunction with one another to supply the various different precursor materials to an epitaxial growth chamber 203 wherein the substrate 101 (and consequently the fins 105) are placed. However, the first precursor delivery system 205, the second precursor delivery system 206, and the third precursor delivery system 208 may have physical components that are similar with each other.

For example, the first precursor delivery system 205, the second precursor delivery system 206, and the third precursor delivery system 208 may each include a gas system 207 and a flow controller 209 (labeled in FIG. 2A with regards to the first precursor delivery system 205 but not labeled for clarity with respect to the second precursor delivery system 206, and the third precursor delivery system 208). In an embodiment in which the first precursor is stored in a gaseous state, the gas system 207 may supply the first precursor to the epitaxial growth chamber 203. The gas system 207 may be a vessel, such as a gas storage tank, that is located either locally to the epitaxial growth chamber 203 or else may be located remotely from the epitaxial growth chamber 203. In another embodiment, the gas system 207 may be a facility that independently prepares and delivers the first precursor to the flow controller 209. Any suitable source for the first precursor may be utilized as the gas system 207, and all such sources are fully intended to be included within the scope of the embodiments.

The gas system 207 may supply the desired precursor to the flow controller 209. The flow controller 209 may be utilized to control the flow of the precursor to the precursor gas controller 213 and, eventually, to the epitaxial growth chamber 203, thereby also helping to control the pressure within the epitaxial growth chamber 203. The flow controller 209 may be, e.g., a proportional valve, a modulating valve, a needle valve, a pressure regulator, a mass flow controller, combinations of these, or the like. However, any suitable method for controlling and regulating the flow of the first precursor may be utilized, and all such components and methods are fully intended to be included within the scope of the embodiments.

Additionally, in an embodiment in which the first precursor is stored in a solid or liquid state, the gas system 207 may also store or receive a carrier gas and the carrier gas may be introduced into a precursor canister (not separately illustrated), which stores the first precursor in the solid or liquid state. The carrier gas is then used to push and carry the first precursor as it either evaporates or sublimates into a gaseous section of the precursor canister before being sent to the precursor gas controller 213. Any suitable method and combination of units may be utilized to provide the first precursor, and all such combinations of units are fully intended to be included within the scope of the embodiments.

However, as one of ordinary skill in the art will recognize, while the first precursor delivery system 205, the second precursor delivery system 206, and the third precursor delivery system 208 have been described herein as having identical components, this is merely an illustrative example and is not intended to limit the embodiments in any fashion. Any type of suitable precursor delivery system, with any type and number of individual components identical to or different from any of the other precursor delivery systems within the epitaxial growth system 200, may be utilized. All such precursor systems are fully intended to be included within the scope of the embodiments.

The first precursor delivery system 205, the second precursor delivery system 206, and the third precursor delivery system 208, may supply their individual precursor materials into a precursor gas controller 213. The precursor gas controller 213 connects and isolates the first precursor delivery system 205, the second precursor delivery system 206, and the third precursor delivery system 208 from the epitaxial growth chamber 203 in order to deliver the desired precursor materials to the epitaxial growth chamber 203 (discussed further below). The precursor gas controller 213 may include such devices as valves, flow meters, sensors, and the like to control the delivery rates of each of the precursors, and may be controlled by instructions received from the control unit 215 (described further below with respect to FIG. 2B).

The precursor gas controller 213, upon receiving instructions from the control unit 215, may open and close valves so as to connect one or more of the first precursor delivery system 205, the second precursor delivery system 206, and the third precursor delivery system 208 to the epitaxial growth chamber 203 and direct a desired precursor material through a manifold 216, into the epitaxial growth chamber 203, and to a showerhead 217. The showerhead 217 may be utilized to disperse one or more of the chosen precursor materials into the epitaxial growth chamber 203 and may be designed to evenly disperse the precursor material in order to minimize undesired process conditions that may arise from uneven dispersal. In an embodiment the showerhead 217 may have a circular design with openings dispersed evenly around the showerhead 217 to allow for the dispersal of the desired precursor materials into the epitaxial growth chamber 203.

However, as one of ordinary skill in the art will recognize, the introduction of precursor materials to the epitaxial growth chamber 203 through a single showerhead 217 or through a single point of introduction as described above is intended to be illustrative only and is not intended to be limiting to the embodiments. Any number of separate and independent showerheads 217 or other openings to introduce the various precursor materials into the epitaxial growth chamber 203 may be utilized. All such combinations of showerheads and other points of introduction are fully intended to be included within the scope of the embodiments.

The epitaxial growth chamber 203 may receive the desired precursor materials and expose the precursor materials to the substrate 101 and the fins 105, and the epitaxial growth chamber 203 may be any desired shape that may be suitable for dispersing the precursor materials and contacting the precursor materials with the substrate 101 and the fins 105. In the embodiment illustrated in FIG. 2A, the epitaxial growth chamber 203 has a cylindrical sidewall and a bottom. However, the epitaxial growth chamber 203 is not limited to a cylindrical shape, and any other suitable shape, such as a hollow square tube, an octagonal shape, or the like, may be utilized. Furthermore, the epitaxial growth chamber 203 may be surrounded by a housing 219 made of material that is inert to the various process materials. As such, while the housing 219 may be any suitable material that can withstand the chemistries and pressures involved in the deposition process, in an embodiment the housing 219 may be steel, stainless steel, nickel, aluminum, alloys of these, combinations of these, and like.

Within the epitaxial growth chamber 203 the substrate 101 may be placed on a mounting platform 221 in order to position and control the substrate 101 and the fins 105 during the epitaxial growth processes. The mounting platform 221 may include heating mechanisms in order to heat the substrate 101 during the epitaxial growth processes. Furthermore, while a single mounting platform 221 is illustrated in FIG. 2A, any number of mounting platforms 221 may additionally be included within the epitaxial growth chamber 203.

Additionally, the epitaxial growth chamber 203 and the mounting platform 221 may be part of a cluster tool system (not shown). The cluster tool system may be used in conjunction with an automated handling system in order to position and place the substrate 101 into the epitaxial growth chamber 203 prior to the epitaxial growth processes, position, hold the substrate 101 during the epitaxial growth processes, and remove the substrate 101 from the epitaxial growth chamber 203 after the epitaxial growth processes.

The epitaxial growth chamber 203 may also have an exhaust outlet 225 for exhaust gases to exit the epitaxial growth chamber 203. A vacuum pump 223 may be connected to the exhaust outlet 225 of the epitaxial growth chamber 203 in order to help evacuate the exhaust gases. The vacuum pump 223, under control of the control unit 215, may also be utilized to reduce and control the pressure within the epitaxial growth chamber 203 to a desired pressure and may also be utilized to evacuate precursor materials from the epitaxial growth chamber 203 in preparation for the introduction of the next precursor material.

FIG. 2B illustrates an embodiment of the control unit 215 that may be utilized to control the precursor gas controller 213 and the vacuum pump 223 (as illustrated in FIG. 2A). The control unit 215 may be any form of computer processor that can be used in an industrial setting for controlling process machines. In an embodiment the control unit 215 may comprise a processing unit 252, such as a desktop computer, a workstation, a laptop computer, or a dedicated unit customized for a particular application. The control unit 215 may be equipped with a display 253 and one or more input/output components 255, such as instruction outputs, sensor inputs, a mouse, a keyboard, printer, combinations of these, or the like. The processing unit 252 may include a central processing unit (CPU) 256, memory 258, a mass storage device 260, a video adapter 264, and an I/O interface 266 connected to a bus 262.

The bus 262 may be one or more of any type of several bus architectures including a memory bus or memory controller, a peripheral bus, or video bus. The CPU 256 may comprise any type of electronic data processor, and the memory 258 may comprise any type of system memory, such as static random access memory (SRAM), dynamic random access memory (DRAM), or read-only memory (ROM). The mass storage device 260 may comprise any type of storage device configured to store data, programs, and other information and to make the data, programs, and other information accessible via the bus 262. The mass storage device 260 may comprise, for example, one or more of a hard disk drive, a magnetic disk drive, or an optical disk drive.

The video adapter 264 and the I/O interface 266 provide interfaces to couple external input and output devices to the processing unit 252. As illustrated in FIG. 2B, examples of input and output devices include the display 253 coupled to the video adapter 264 and the I/O component 255, such as a mouse, keyboard, printer, and the like, coupled to the I/O interface 266. Other devices may be coupled to the processing unit 252, and additional or fewer interface cards may be utilized. For example, a serial interface card (not shown) may be used to provide a serial interface for a printer. The processing unit 252 also may include a network interface 268 that may be a wired link to a local area network (LAN) or a wide area network (WAN) 270 and/or a wireless link.

It should be noted that the control unit 215 may include other components. For example, the control unit 215 may include power supplies, cables, a motherboard, removable storage media, cases, and the like. These other components, although not shown in FIG. 2B are considered part of the control unit 215.

In preparation for the formation of the source/drain regions 201, a first precursor material is placed into or formed by the first precursor delivery system 205. For example, in an embodiment in which a doped semiconductor material such as silicon phosphorous is desired to be grown, the first precursor material may be a silicon-containing precursor material such as dichlorosilane (DCS), although other suitable precursors, such as silane ($SiH_4$) or disilane ($Si_2H_6$), may also be utilized. All suitable precursor materials are fully intended to be included within the scope of the embodiments.

Additionally, a second precursor material may be placed into or formed by the second precursor delivery system 206. In the embodiment the second precursor may be used to provide a doping material that complements the semiconductor material present in the first precursor material. For example, in an embodiment in which a layer of silicon doped with phosphorous (SiP) is desired to be grown as the source/drain regions 201 and the first precursor material is dichlorosilane, the second precursor material may be a material that comprises the desired dopant such as phosphorous (P). In a particular embodiment the second precursor material is $PH_3$. However, any suitable dopant containing material, such as arsenic (As) or antimony (Sb), may be utilized and placed within the second precursor delivery system 206.

In addition to the first precursor material and the second precursor material that are collectively utilized to grow the desired material (e.g., SiP), an etching precursor may also be utilized during the growth process, and may be placed in the third precursor delivery system 208. In an embodiment in which the material to be grown will at least partially deposit on materials other than the exposed fins 105 (such as by growing on the exposed surfaces of the first spacers 113), the addition of an etching precursor will work to remove epitaxially grown material from these undesired locations, and helps to cause the selective growth be more selective. In an embodiment the etching precursor is a precursor that will remove undesired growth of the grown material while still allowing for growth of the desired material over the fins 105, and may be an etchant such as hydrochloric acid (HCl). However, any suitable etching precursor may be utilized.

Once the first precursor material, the second precursor material, and the etching precursor are ready in the first precursor delivery system 205, the second precursor delivery system 206, and the third precursor delivery system 208, respectively, the formation of the source/drain regions 201 may be initiated by the control unit 215 sending an instruction to the precursor gas controller 213 to start a first step and connect the first precursor delivery system 205, the second precursor delivery system 206, and the third precursor delivery system 208 to the epitaxial growth chamber 203. Once connected, the first precursor delivery system 205, the second precursor delivery system 206 and the third precursor delivery system 208 can deliver the first precursor material (e.g., dichlorosilane), the second precursor material (e.g., PH$_3$), and the etching precursor (e.g., HCl) to the showerhead 217 through the precursor gas controller 213 and the manifold 216. The showerhead 217 can then disperse the first precursor material, the second precursor material, and the etching precursor into the epitaxial growth chamber 203, wherein the first precursor material and the second precursor material can react to the exposed surface of the fins 105 and begin to grow the source/drain regions 201 on the exposed sections of the fins 105.

In an embodiment in which the source/drain regions 201 are, e.g., SiP, the first precursor material (e.g., dichlorosilane) may be flowed into the epitaxial growth chamber 203 at a flow rate of between about 10 sccm and about 10000 sccm, such as about 500 sccm while the second precursor material (e.g., PH$_3$) is flowed into the epitaxial growth chamber 203 at a flow rate of between about 10 sccm and about 1000 sccm, such as about 100 sccm. Additionally, the epitaxial growth chamber 203 during the first step may be held at a pressure of between about 5 Torr and about 1000 Torr, such as about 100 Torr, and a temperature of between about 400° C. and about 1000° C., such as about 600° C. However, as one of ordinary skill in the art will recognize, these process conditions are only intended to be illustrative, as any suitable process conditions may be utilized while remaining within the scope of the embodiments.

Additionally, while the first precursor material and the second precursor material are being introduced into the epitaxial growth chamber 203, the first precursor material and the second precursor material will react not solely on the fins 105 (where the growth is desired), but may also occur on other structures, such as the first spacers 113 (where the growth is not desired). To remove this undesired growth, the etching precursor is also added during the first step of the growth process along with the first precursor material and the second precursor material. In an embodiment in which the source/drain regions 201 are SiP and the etching precursor is hydrochloric acid, the etching precursor may be flowed into the epitaxial growth chamber 203 at a flow rate of between about 10 sccm and about 30000 sccm, such as about 100 sccm. Such a flow rate will work to remove grown material from surfaces where it is undesired. However, any suitable flow rate may be utilized.

In an embodiment the growth of the source/drain regions 201 in the first step is continued to grow the source/drain regions 201. For example, the first step may be continued for a time period of between about 10 seconds and about 1000 seconds, such as about 500 seconds. However, any suitable time or dimension may be utilized.

Additionally, as one of ordinary skill in the art will recognize, the above described process is merely exemplary and is not intended to limit the embodiments. For example, the epitaxial growth system 200 may also include a purge gas delivery system 214 to deliver a purge gas to the epitaxial growth chamber 203. In an embodiment the purge gas delivery system 214 may be a gaseous tank or other facility that provides a purge gas such as nitrogen, argon, xenon, or other non-reactive gas to the epitaxial growth chamber 203. Additionally, during a purge the control unit 215 may also initiate the vacuum pump 223 in order to apply a pressure differential to the epitaxial growth chamber 203 to aid in the removal of the precursor materials between the various steps. The purge gas, along with the vacuum pump 223, may purge the precursor materials from the epitaxial growth chamber 203.

FIGS. 2C-2E illustrate various stages of the growth process of the source/drain regions 201 onto the fins 105. Looking first at the structure of FIG. 2C (including both FIGS. 2C-1 and 2C-2), in one embodiment the growth of the source/drain regions 201 begins by increasing the volume of the fins 105 in every direction. Additionally, as the deposited material continues to expand, facets (illustrated in FIG. 2C with the dashed circle labeled 251) will begin to form, causing the source/drain regions 201 to begin to form into a diamond shape with facets 251 that have specific angles. In a particular embodiment, the facets 251 will form with surfaces that have a (110) crystalline orientation of the material.

FIG. 2D illustrates that, as the growth of the source/drain regions 201 continues to expand in volume in each direction along the now formed crystalline orientations, the separate source/drain regions 201 will make physical contact with each other. Subsequent growth will cause the source/drain regions 201 being grown on adjacent fins 105 to begin to merge into a single source/drain region 201 that is over multiple ones of the fins 105. Additionally, at this point the facets 251 are clearly formed along their directions and along the (110) crystalline orientation.

FIG. 2E illustrates a continuation of the growth of the source/drain regions 201 until the growth is halted. In an embodiment the growth may be continued until the merger of the source/drain regions 201 into a single source/drain region 201 is complete. In a particular embodiment the single source/drain region 201 will have a top surface that is minimally curved, if curved at all. Additionally, because the facets are unable to continue to grow along the (110) direction, the top surface of the single source/drain region 201 will be forced into another crystallographic orientation, such as a (100) orientation.

In an embodiment, after the formation of the single source/drain region 201, the single source/drain region 201 may have a second width W$_2$ of between about 20 nm and about 2000 nm. Additionally, the single source/drain region 201 may also have a first height H$_1$ above the first isolation regions 107 of between about 10 nm and about 2000 nm. However, any suitable dimensions may be utilized.

Figure 3A:
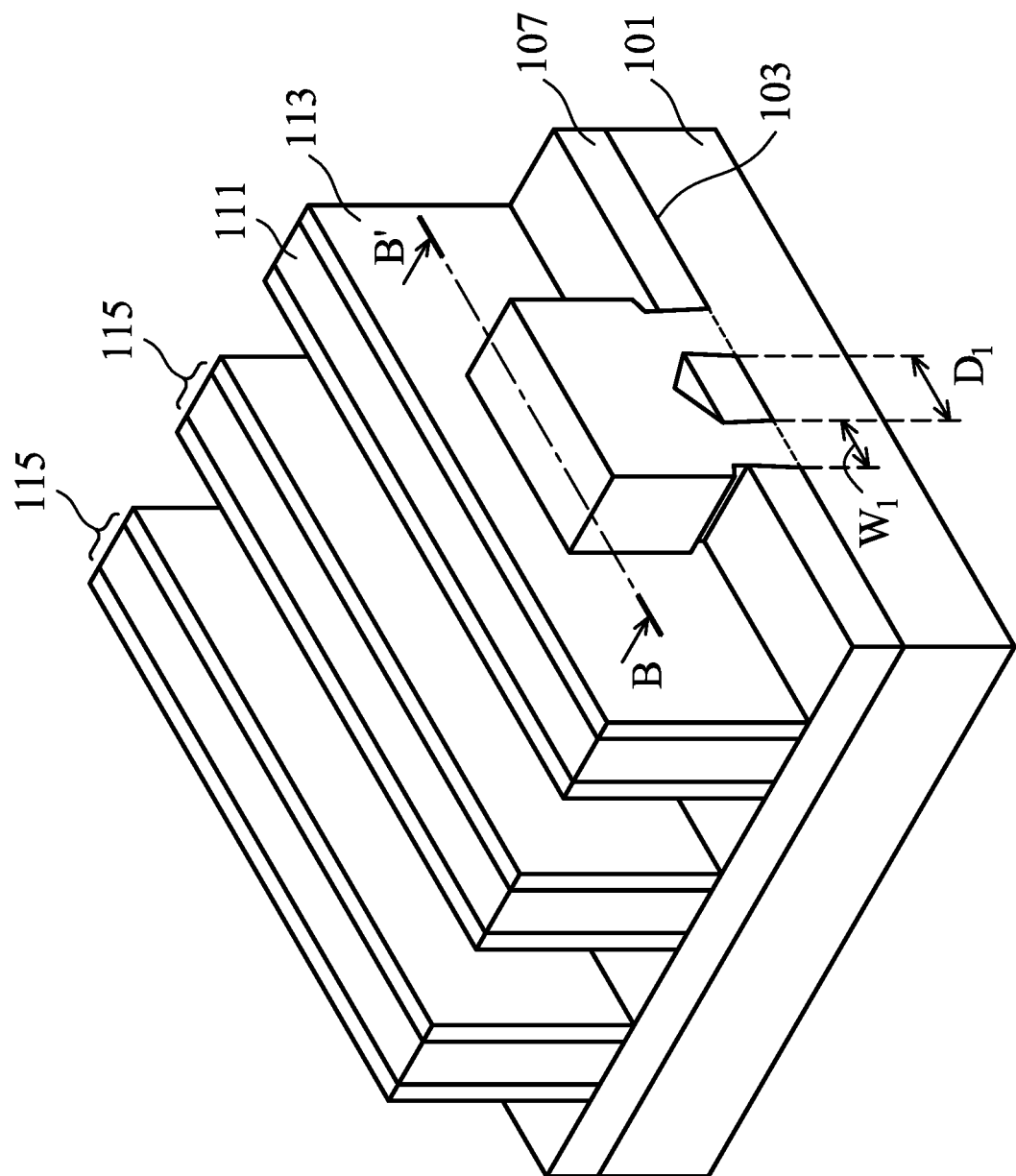
FIGS. 3A-3B illustrate a shaping process of the source/drain region in accordance with some embodiments.
Figure 3B:
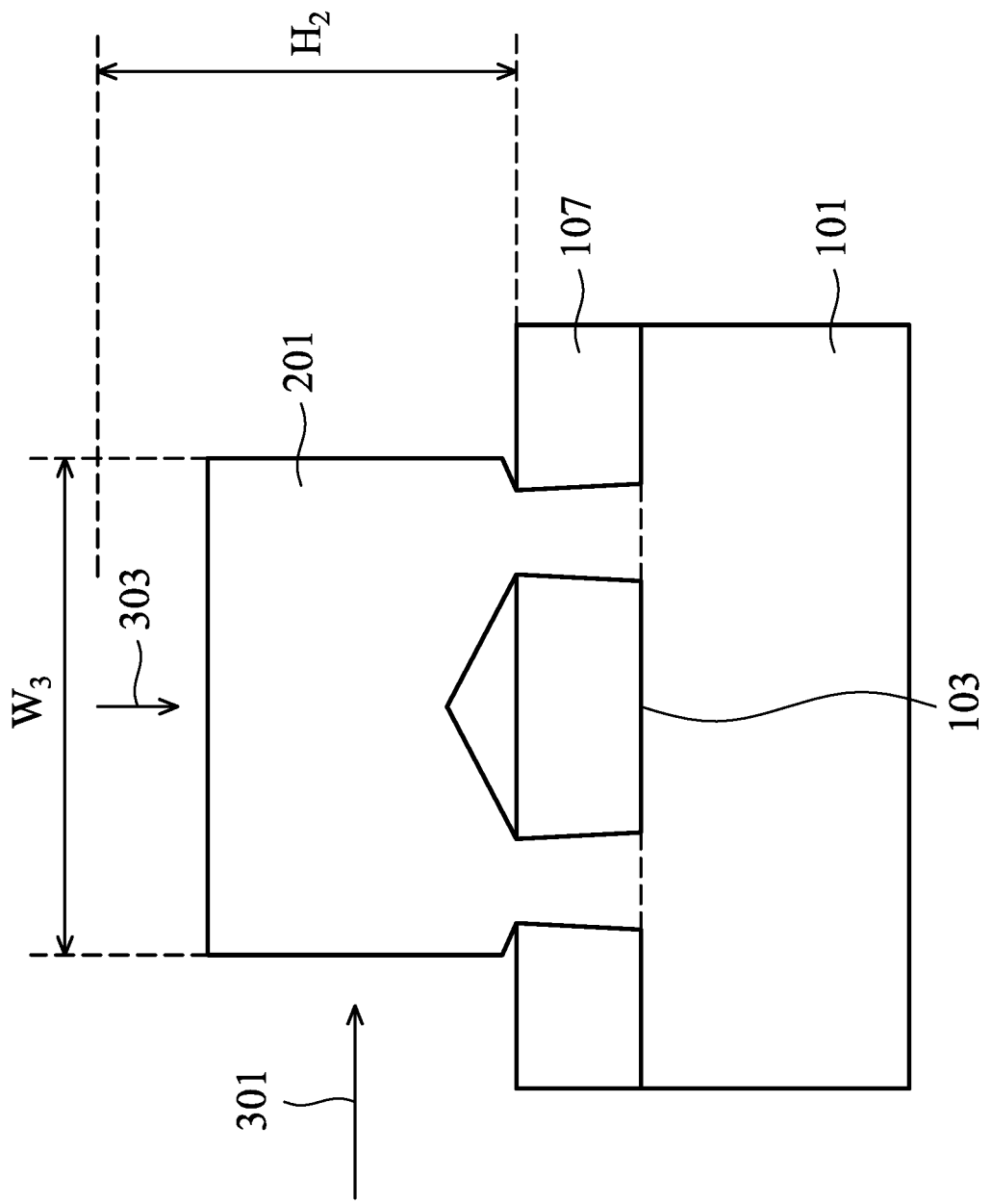

FIGS. 3A-3B illustrate that, after the epitaxial growth of the source/drain regions 201 (see FIG. 2E) have been completed and stopped, the shape of the single source/drain regions 201 formed through the growth process may be modified through a second step. In an embodiment the shape of the merged source/drain regions 201 may be modified using, e.g., a selective etching process which will have a first etch rate along a first direction 301 (e.g., parallel with a major surface of the substrate 101) and a second etch rate less than the first etch rate in a second direction 303 perpendicular with the substrate 101.

For example, in a particular embodiment the selective etching process may be initiated by the control unit 215 sending an instruction to the precursor gas controller 213 to start the selective etching step and connect the third precursor delivery system 208 to the epitaxial growth chamber 203. Once connected, the third precursor delivery system 208 can deliver the etching precursor (e.g., HCl) to the showerhead 217 through the precursor gas controller 213 and the manifold 216 without the first precursor or the second precursor. The showerhead 217 can then disperse the etching precursor into the epitaxial growth chamber 203, wherein the etching precursor can react to the exposed surface of the single source/drain regions 201 and begin to reshape the single source/drain regions 201.

In another embodiment, instead of using the etching precursor by itself, the etching precursor may be supplied to the epitaxial growth chamber 203 as part of a mixture of gases. For example, the etching precursor may be mixed with the first precursor material to form a gas mixture such as HCl and SiH$_4$. In another embodiment the etching precursor may be mixed with another precursor material altogether to form a gas mixture such as HCl and GeH$_4$. Any suitable combination of gases may be used.

During the selective etching process, the etching precursor may be flowed into the epitaxial growth chamber 203 at a flow rate of between about 0.1 sccm and about 100000 sccm, such as about 1000 sccm. Additionally, the pressure within the epitaxial growth chamber 203 may be held to a pressure of between about 0.0000001 torr and about 760 torr, such as about 150 torr, while the temperature of the chamber 203 may be held to be between about 400° C. and about 1000° C., such as about 600° C. However, any suitable process and chamber conditions may be utilized to perform the selective etching process.

In a particular example, in an embodiment in which the etchant is HCl and the source/drain regions 201 are silicon with phosphorous, the etchant will preferentially react with the silicon along the surface with a (110) crystalline orientation instead of the surface with a (100) crystalline orientation. As such, because the surfaces with the (110) crystalline orientation are the surfaces along the facets 251 and the surface with the (100) crystalline orientation are located facing away from the substrate 101, the etchant will preferentially etch in a lateral direction parallel with the substrate 101 and will less preferentially etch in a vertical direction. For example, the etchant may preferentially etch in the lateral direction parallel with the substrate 101 at a first etch rate of between about 1 nm/sec and about 100 nm/sec, such as about 20 nm/sec, while the etchant may less preferentially etch in the vertical direction at a second etch rate of between about 0.0001 nm/sec and about 0.1 nm/sec, such as about 0.01 nm/sec. However, any suitable etch rates may be utilized.

Additionally, while the selective etching process will proceed to reduce the width of the source/drain regions 201 in a lateral direction while only minimally reducing the height of the source/drain regions 201, the selective etching process will not separate the merged source/drain regions 201 that have already merged with each other. In particular, the merging of the source/drain regions 201 work to limit the exposure of the interior surfaces of the source/drain regions 201 such that these surfaces are minimally etched if they are etched at all.

Through the use of the growth and selective etching processes as described above with respect to FIGS. 2A-3B, the facets 251 of the source/drain regions 201 may be removed, and the overall shape of the source/drain regions 201 may be reshaped into a structure without the facets 251, such as a box shaped structure that has sidewalls that are substantially vertical or perpendicular with a major surface of the substrate 101. In an embodiment the box-shaped structure may have relatively straight sidewalls and an overall third width $W_3$ that is less than the second width $W_2$, such as by being between about 20 nm and about 2000 nm. Additionally, the source/drain regions 201 may have an overall second height $H_2$ (above the first isolation regions 107) of between about 10 nm and about 2000 nm. However, any suitable dimension may be utilized.

In another embodiment the first step (selective growth) and the second step (selective etching) may be repeated. For example, while the process described above utilizes the first step and the second step, in other embodiments the first step and the second step may be repeated. In a particular embodiment the first step and the second step may be repeated one or more times, such as between about 1 and about 200 times. However, the first step and the second step may be repeated any suitable number of times.

After the growth of the source/drain regions 201, additional processing may be performed in order to finish and connect the finFET device formed using the source/drain regions 201. For example, an interlayer dielectric may be formed over the gate stacks 115, a replacement gate may be optionally formed, and contacts to the source/drain regions 201 and the gate electrode 111 may be formed. Any suitable process or structures may be formed to use and interconnect the finFET device, and all such processes and structures are fully intended to be included within the scope of the embodiments.

By reshaping the source/drain regions 201 to remove the facets 251 such that the source/drain regions 201 does not have the diamond shape, bridging that may otherwise occur when the epitaxial growth occurs in every direction may be avoided. As such, the source/drain regions 201 may be formed to a larger size. A larger sized source/drain region 201 further allows for a reduction in the resistance of the channel ($R_{ch}$) and the parasitic resistance ($R_p$), allowing for a device boost.

Figure 4A:
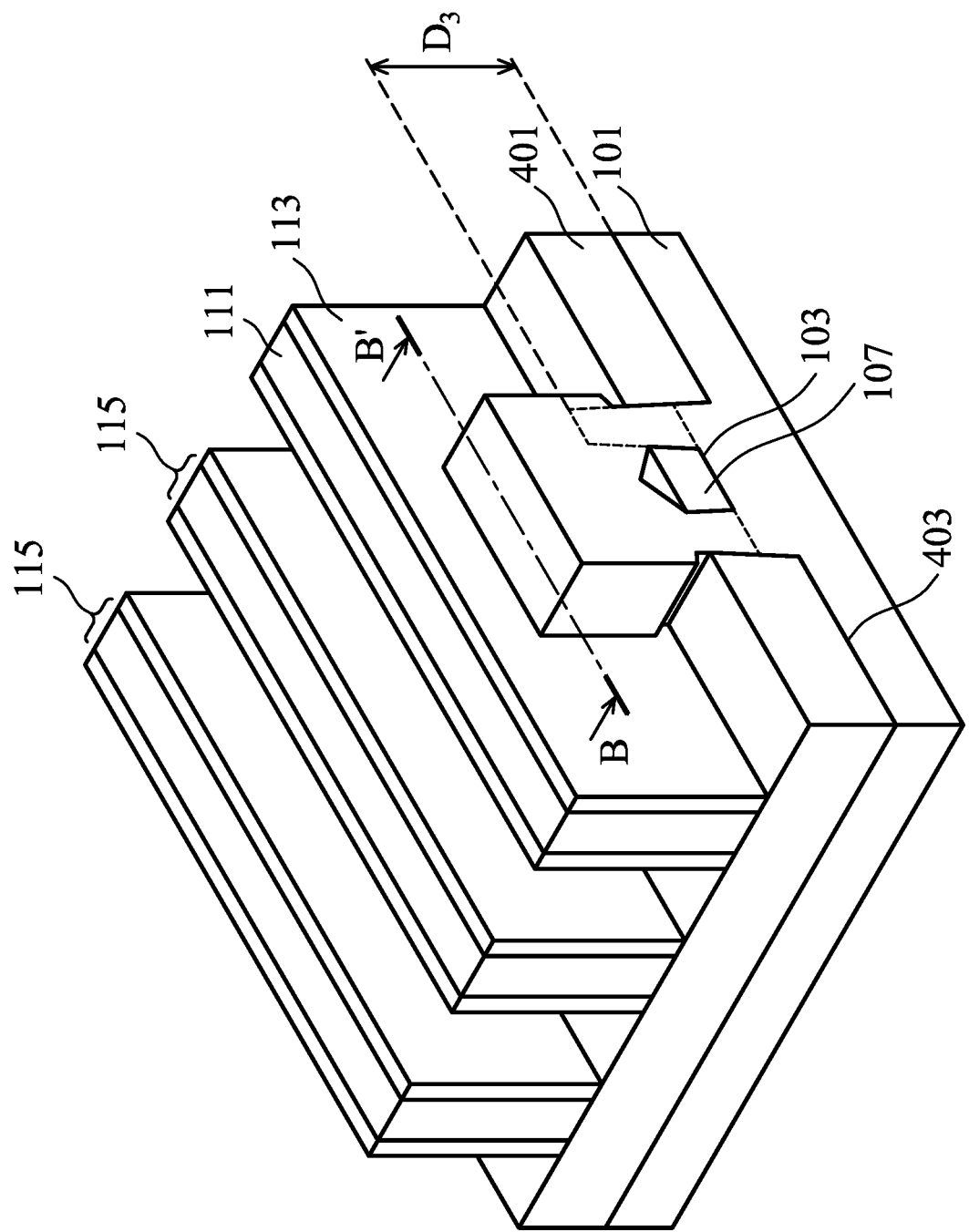
FIGS. 4A-4B illustrate an embodiment with isolation structures having different depths in accordance with some embodiments.
Figure 4B:
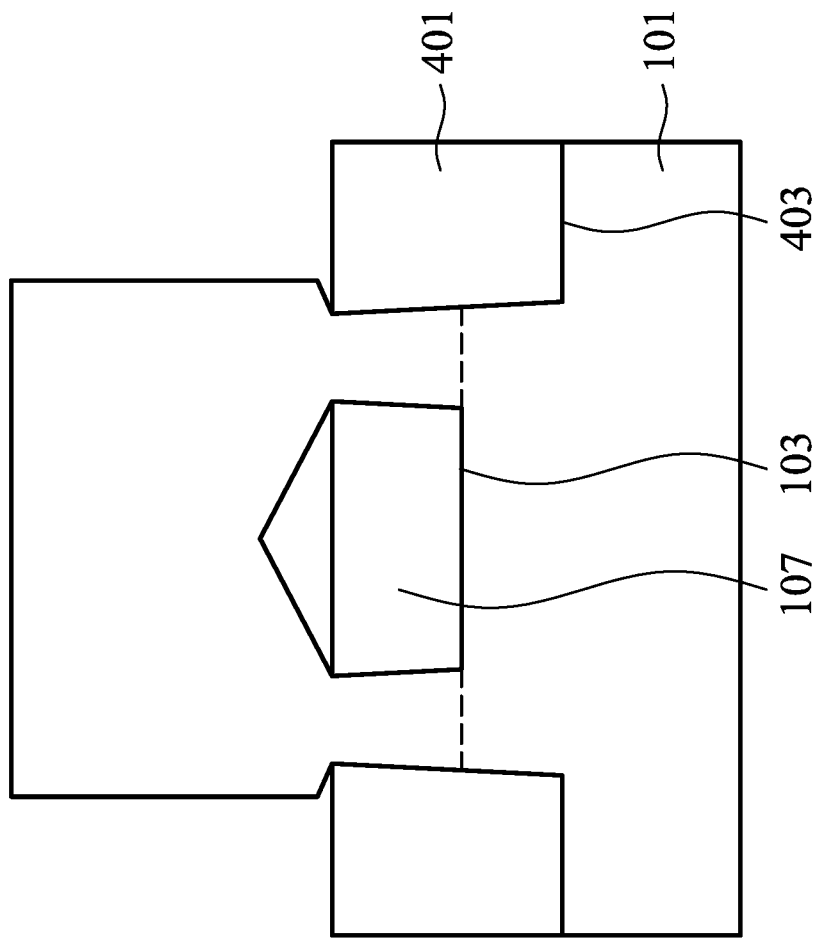

FIGS. 4A-4B illustrate another embodiment in which the first isolation regions 107 are used to isolate the fins 105 from each other, and second isolation regions 401 are used to isolate the fins 105 from other sections of the substrate 101 such as separate groupings of fins 105 (not separately illustrated), with FIG. 4B being a cross-sectional view of FIG. 4A along lines B-B', respectively. In this embodiment the second isolation regions 401 may be formed by initially forming second trenches 403. The second trenches 403 may be formed prior to, after, or even partially along with the first trenches 103, such as by using a photolithographic masking and etching process similar to the process described above with respect to the formation of the first trenches 103. For example, in one embodiment openings for the second trenches 403 may be initially made within the substrate 101 with a first masking and etching process and then these openings may be extended at the same time that the first trenches 103 are formed with a second masking and etching process. However, the second trenches 403 may be formed to extend a third distance $D_3$ from the top of the substrate 101 (prior to growth of the source/drain regions 201, shown in FIG. 4A using a dashed outline) that is deeper than the first trenches 103. In a particular embodiment the first trenches 103 may be formed to have a depth of between about 100 Å and about 1,500 Å, such as about 1,000 Å, and the second trenches 403 may be formed such that the third distance $D_3$ is between about 200 Å and about 7,000 Å, such as about 3,190 Å. However, any suitable depths may be utilized.

Once the second trenches 403 have been formed along with the first trenches 103, the first trenches 103 and the second trenches 403 may be filled with the dielectric material to form the first isolation regions 107 and the second isolation region 401. In an embodiment the first trenches 103 and the second trenches 403 may be filled as described above with respect to FIGS. 1A-1B. For example, the dielectric material may be deposited such that the dielectric material fills the first trenches 103 and the second trenches 403, and then the dielectric material may be recessed to expose the top surfaces of the fins 105 and form the first isolation regions 107 and the second isolation regions 401. Once the first isolation regions 107 and the second isolation regions 401 have been formed, processing may continue as described above to form the gate stacks 115 and the source/drain regions 201.

By utilizing the second isolation regions 401 along with the first isolation regions 107, a better tuning of the isolation may be obtained. For example, the first isolation regions 107 may be tuned to the specific desires of intra-fin isolation (between fins 105 covered by a same gate stack 115), while the second isolation regions 401 may be tuned to the specific desires of inter-fin isolation (between fins 105 covered by separated gate stack, not separately illustrated). Such ability to tune the isolation regions allows for greater process variability.

In accordance with an embodiment, a method of manufacturing a semiconductor device comprising forming a gate stack over a semiconductor fin, the semiconductor fin being over a substrate, is provided. A source/drain region is selectively grown adjacent to the gate stack, and the source/drain region is reshaped after the selectively growing the source/drain region, wherein the reshaping the source/drain region forms a substantially vertical sidewall.

In accordance with another embodiment, a method of manufacturing a semiconductor device comprising growing a first source/drain region over a first fin and a second source/drain region over a second fin, the first fin and the second fin being located over a substrate is provided. The first source/drain region and the second source/drain region are merged to form a merged source/drain region. The merged source/drain region are reshaped, wherein the reshaping the merged source/drain region comprises selectively etching the merged source/drain region, wherein an etch rate in a direction parallel with a major surface of the substrate is larger than an etch rate in a direction substantially perpendicular with the major surface of the substrate.

In accordance with yet another embodiment, a semiconductor device comprising a gate stack over a first semiconductor fin over a substrate and a spacer adjacent to the gate stack is provided. A source/drain region is adjacent to the spacer, the source/drain region comprising a first surface facing away from the substrate and a second surface, wherein the second surface is substantially vertical.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a first semiconductor fin over a semiconductor substrate;
    forming an isolation region over the semiconductor substrate and surrounding lower portions of the first semiconductor fin;
    forming a gate stack over the first semiconductor fin and the isolation region;
    recessing the first semiconductor fin using the gate stack as a mask;
    selectively growing a source/drain region on the recessed first semiconductor fin adjacent to the gate stack, the source/drain region having a top surface and sidewalls, the top surface being parallel with a major surface of the semiconductor substrate at the end of the selectively growing, the top surface and the sidewalls having a same material composition, the top surface extending from one of the sidewalls to the other one of the sidewalls; and
    reshaping the source/drain region after the selectively growing the source/drain region, the top surface of the source/drain region being exposed during the entirety of the reshaping, wherein the reshaping the source/drain region forms a substantially vertical sidewall.

2. The method of claim 1, wherein after the selectively growing the source/drain region and prior to the reshaping the source/drain region, the source/drain region has a diamond shape.

3. The method of claim 1, wherein the reshaping the source/drain region comprises contacting the source/drain region with an etching precursor.

4. The method of claim 3, wherein the etching precursor is hydrochloric acid.

5. The method of claim 1, wherein the selectively growing the source/drain region comprises:
    growing a first portion of the source/drain region on the first semiconductor fin; and
    growing a second portion of the source/drain region on a second semiconductor fin.

6. The method of claim 5, wherein the selectively growing the source/drain region further comprises merging the first portion of the source/drain region and the second portion of the source/drain region, wherein during the merging of the first portion of the source/drain region and the second portion of the source/drain region, the top surface of the merged source/drain region being curved, and wherein after the merging, the entirety of the top surface having a single crystallographic orientation.

7. A method of manufacturing a semiconductor device, the method comprising:
growing a first source/drain region over a first fin and a second source/drain region over a second fin, the first fin and the second fin being located over a substrate;
merging the first source/drain region and the second source/drain region to form a merged source/drain region, the merged source/drain region having a top surface, a bottom surface and sidewalls, the top surface extending from one of the sidewalls to the other one of the sidewalls, the bottom surface extending from a first sidewall of the first fin to a second sidewall of the second fin, the first sidewall of the first fin facing the second sidewall of the second fin, wherein during the merging of the first source/drain region and the second source/drain region, the top surface of the merged source/drain region being curved, wherein the entirety of the top surface and the entirety of the bottom surface have a same material composition after the merging, and wherein the entirety of the top surface has a single crystallographic-orientation after the merging; and
reshaping the merged source/drain region, wherein the reshaping the merged source/drain region comprises selectively etching the merged source/drain region with a first etchant in a first selective etch process, the top surface and the sidewalls of the merged source/drain region being exposed to the first etchant in the first selective etch process, wherein an etch rate in a direction parallel with a major surface of the substrate is larger than an etch rate in a direction substantially perpendicular with the major surface of the substrate, wherein the first selective etch process comprises supplying a gas mixture to the merged source/drain region, the gas mixture comprising hydrochloric acid and silane.

8. The method of claim 7, wherein the reshaping the merged source/drain region removes facets from the merged source/drain region.

9. The method of claim 8, wherein the facets have a surface with a (no) crystallographic orientation.

10. The method of claim 7, wherein after the reshaping the merged source/drain region the merged source/drain region has substantially vertical sidewalls.

11. The method of claim 7, wherein the reshaping the merged source/drain region comprises contacting the merged source/drain region with a gaseous etchant.

12. The method of claim 11, wherein the gaseous etchant is hydrochloric acid.

13. A method of manufacturing a semiconductor device, the method comprising:
forming a first fin and a second fin over a substrate;
forming an isolation region over the substrate and surrounding lower portions of the first fin and the second fin;
forming a gate stack over the first fin and the second fin;
forming a spacer adjacent to the gate stack;
etching the first fin and the second fin using the gate stack and spacer as a etch mask, the etching forming a first recess in the first fin and a second recess in the second fin, the first and second recesses having bottom surfaces lower than a top surface of the isolation region;
performing an epitaxial growth process to grow a first source/drain region in the first recess and a second source/drain region in the second recess, wherein the epitaxial growth process merges the first source/drain region and the second source/drain region to form a merged source/drain region, wherein during the epitaxial growth process, the merged source/drain region has a curved top surface, wherein after the epitaxial growth process, the curved top surface of the merged source/drain region is a flat top surface, the merged source/drain region comprising a bottom surface and sidewalls, the entirety of the bottom surface, the entirety of the flat top surface and the entireties of the sidewalls having a same material composition, the bottom surface extending from a first sidewall of the first fin to a second sidewall of the second fin, the first sidewall of the first fin facing the second sidewall of the second fin, the flat top surface extending from one of the sidewalls to the other one of the sidewalls; and
after the epitaxial growth process is completed, reshaping the merged source/drain region with a first selective etch process, wherein the first selective etch process comprises supplying an etchant precursor and a silicon-based precursor, wherein the flat top surface and sidewalls of the merged source/drain region are exposed to the etchant precursor during the first selective etch process.

14. The method of claim 13, wherein after the reshaping the merged source/drain region, the reshaped merged source/drain region comprises a sidewall that is substantially vertical.

15. The method of claim 13, wherein the etchant precursor comprises hydrochloric acid.

16. The method of claim 15, wherein during the first selective etch process an etch rate in a direction parallel with a major surface of the substrate is larger than an etch rate in a direction substantially perpendicular with the major surface of the substrate.

17. The method of claim 13, wherein the forming the gate stack forms the gate stack over a second fin different from the first fin.

18. The method of claim 3, wherein the etching precursor has a first etch rate in a direction parallel with the major surface of the semiconductor substrate, and a second etch rate in a direction substantially perpendicular with the major surface of the semiconductor substrate, the first etch rate being larger than the second etch rate.

19. The method of claim 18, wherein the first etch rate is in a range from 1 nm/sec to 100 nm/sec, and the second etch rate is in a range from 0.0001 nm/sec to 0.1 nm/sec.

20. The method of claim 9, wherein the entirety of the top surface has a (100) crystallographic orientation.

* * * * *

UNITED STATES PATENT AND TRADEMARK OFFICE
CERTIFICATE OF CORRECTION

PATENT NO. : 10,515,951 B2  
APPLICATION NO. : 15/401923  
DATED : December 24, 2019  
INVENTOR(S) : Shih-Chieh Chang et al.

Page 1 of 1

It is certified that error appears in the above-identified patent and that said Letters Patent is hereby corrected as shown below:

In the Claims

In Column 15, Line 40, Claim 9, delete "(no)" and insert --(110)--.

Signed and Sealed this
Fifth Day of May, 2020

Andrei Iancu
*Director of the United States Patent and Trademark Office*